(12) United States Patent
Sakai et al.

(10) Patent No.: US 12,713,538 B2
(45) Date of Patent: Aug. 18, 2026

(54) PRINTED WIRING BOARD

(71) Applicant: IBIDEN CO., LTD., Ogaki (JP)

(72) Inventors: Jun Sakai, Ogaki (JP); Kyohei Yoshikawa, Ogaki (JP); Shunya Hatanaka, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 224 days.

(21) Appl. No.: 18/597,975

(22) Filed: Mar. 7, 2024

(65) Prior Publication Data

US 2024/0306312 A1 Sep. 12, 2024

(30) Foreign Application Priority Data

Mar. 7, 2023 (JP) ................................ 2023-034947

(51) Int. Cl.
*H05K 3/40* (2006.01)
*H05K 1/03* (2006.01)
*H05K 1/11* (2006.01)
*H05K 3/16* (2006.01)
*H05K 3/42* (2006.01)

(52) U.S. Cl.
CPC ......... *H05K 3/4076* (2013.01); *H05K 1/0373* (2013.01); *H05K 1/116* (2013.01); *H05K 3/16* (2013.01); *H05K 3/429* (2013.01); *H05K 3/423* (2013.01); *H05K 2201/0209* (2013.01); *H05K 2201/0263* (2013.01); *H05K 2201/2072* (2013.01)

(58) Field of Classification Search
None
See application file for complete search history.

(56) References Cited

U.S. PATENT DOCUMENTS

2021/0305209 A1* 9/2021 Chen ....................... H01L 24/80

FOREIGN PATENT DOCUMENTS

JP 2009-076934 A 4/2009
WO WO-2022131826 A1 * 6/2022 ........... H05K 1/0373

OTHER PUBLICATIONS

WO 2022131826 A1 Translation (Year: 2025).*

* cited by examiner

*Primary Examiner* — Timothy J Thompson
*Assistant Examiner* — John B Freal
(74) *Attorney, Agent, or Firm* — Finnegan, Henderson, Farabow, Garrett & Dunner, LLP

(57) ABSTRACT

A printed wiring board includes a first conductor layer, a resin insulating layer formed on the first conductor layer, a second conductor layer formed on a surface of the resin insulating layer, and a via conductor formed in the resin insulating layer such that the via conductor is connecting the first and second conductor layers and has a land portion extending on a boundary part of the resin insulating layer. The via conductor is formed in a via hole formed in the resin insulating layer. The resin insulating layer is formed such that the boundary part has a surface roughness that is larger than a surface roughness of the surface on which the second conductor layer formed and that an inner wall surface in the via hole in the resin insulating layer is equal to or larger than the surface roughness of the boundary part of the resin insulating layer.

20 Claims, 13 Drawing Sheets

PRINTED WIRING BOARD

CROSS-REFERENCE TO RELATED APPLICATIONS

The present application is based upon and claims the benefit of priority to Japanese Patent Application No. 2023-034947, filed Mar. 7, 2023, the entire contents of which are incorporated herein by reference.

BACKGROUND OF THE INVENTION

Field of the Invention

The present invention relates to a printed wiring board.

Description of Background Art

Japanese Patent Application Laid-Open Publication No. 2009-76934 describes a multilayer printed wiring board formed by alternately laminating interlayer resin insulating layers and conductor patterns. The entire contents of this publication are incorporated herein by reference.

SUMMARY OF THE INVENTION

According to one aspect of the present invention, a printed wiring board includes a first conductor layer, a resin insulating layer formed on the first conductor layer, a second conductor layer formed on a surface of the resin insulating layer, and a via conductor formed in the resin insulating layer such that the via conductor is connecting the first conductor layer and the second conductor layer and has a land portion extending on a boundary part of the resin insulating layer. The via conductor is formed in a via hole formed in the resin insulating layer, and the resin insulating layer is formed such that the boundary part has a surface roughness that is larger than a surface roughness of the surface on which the second conductor layer is formed and that a surface roughness of an inner wall surface in the via hole formed in the resin insulating layer is equal to or larger than the surface roughness of the boundary part of the resin insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a cross-sectional view illustrating a printed wiring board according to an embodiment of the present invention;

FIG. 3C is a cross-sectional view illustrating an example of a manufacturing process of a printed wiring board according to an embodiment of the present invention;

DETAILED DESCRIPTION OF THE EMBODIMENTS

Figure 2A:
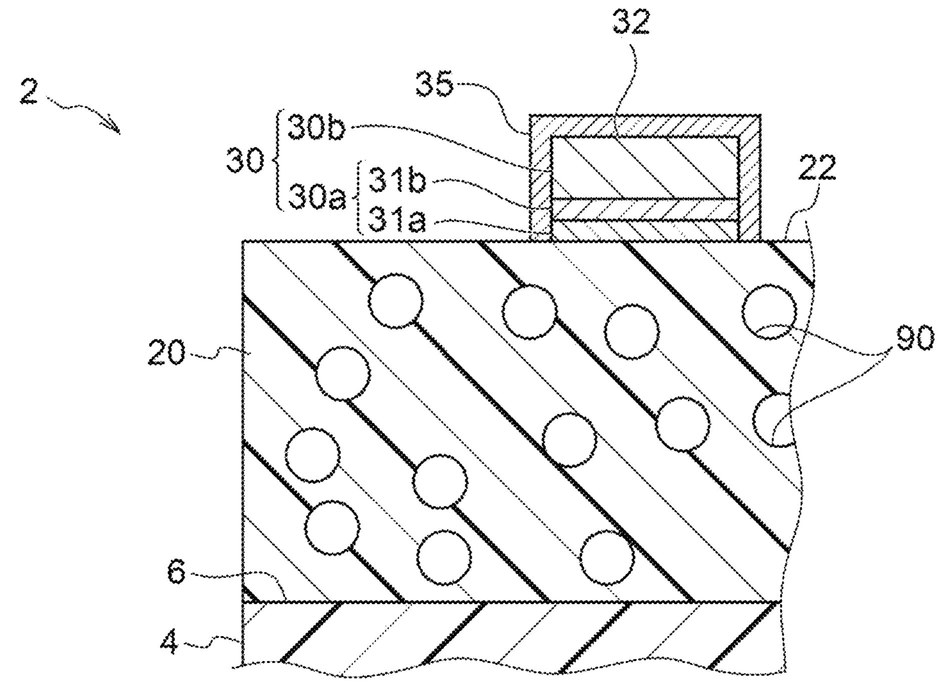
FIG. 2A is a partially enlarged cross-sectional view illustrating a printed wiring board according to an embodiment of the present invention.

Embodiments will now be described with reference to the accompanying drawings, wherein like reference numerals designate corresponding or identical elements throughout the various drawings.

Figure 1:
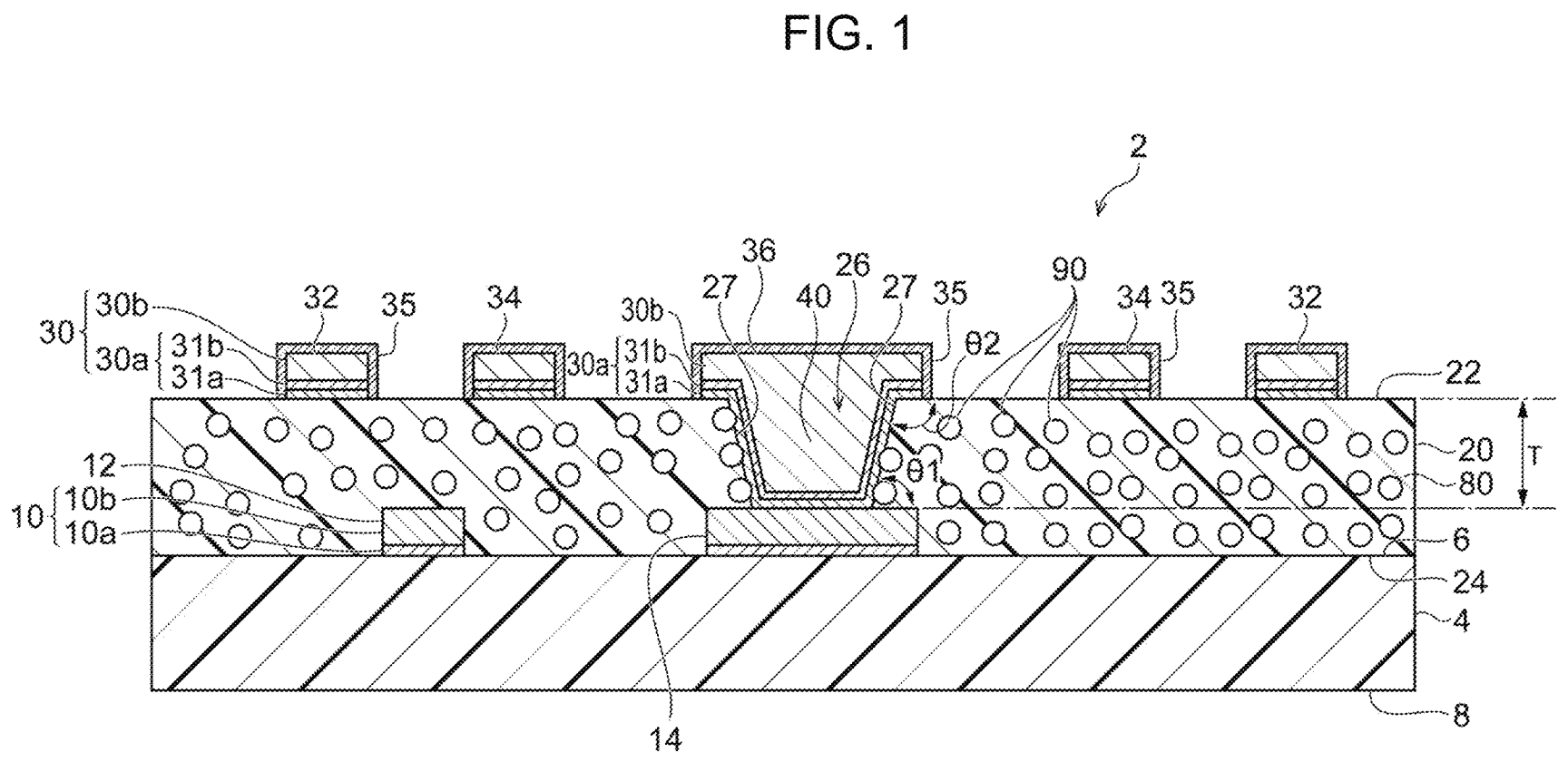
Figure 2B:
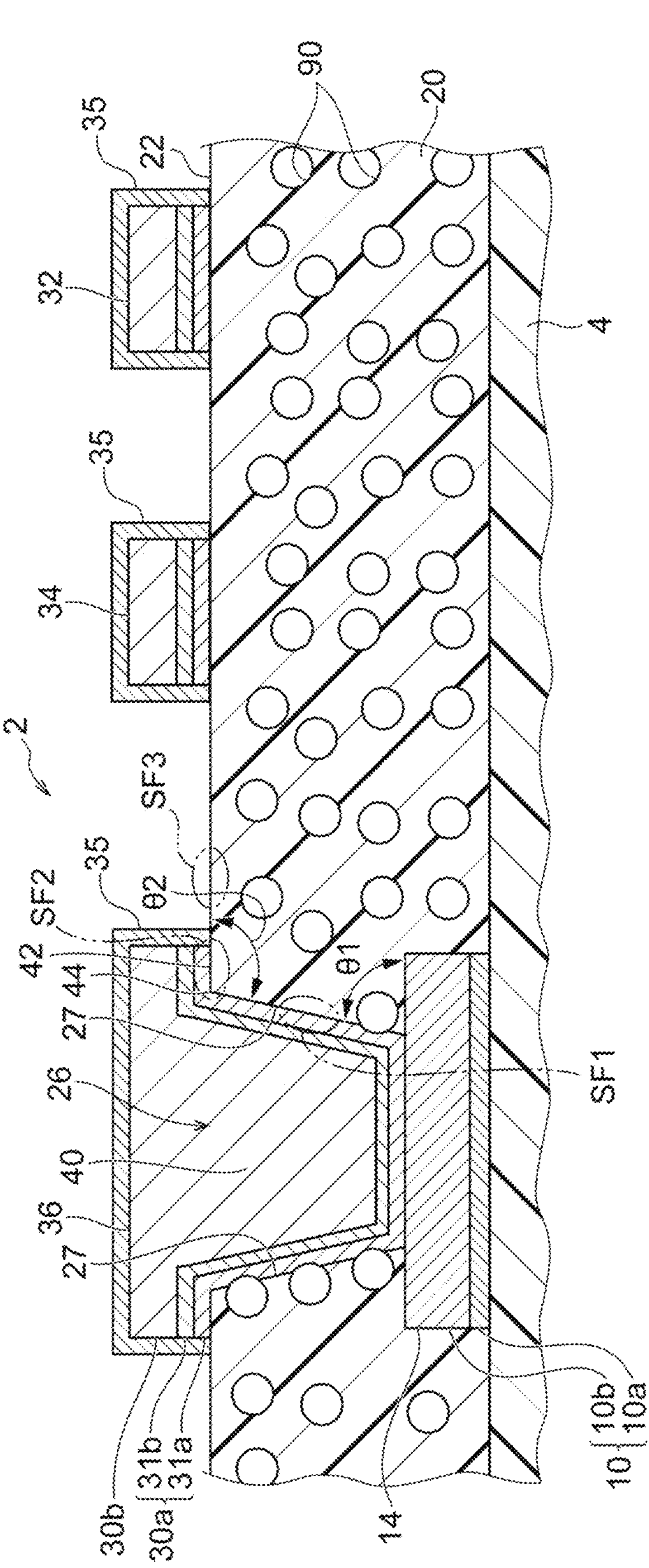
FIG. 2B is a partially enlarged cross-sectional view illustrating a printed wiring board according to an embodiment of the present invention.
Figure 2C:
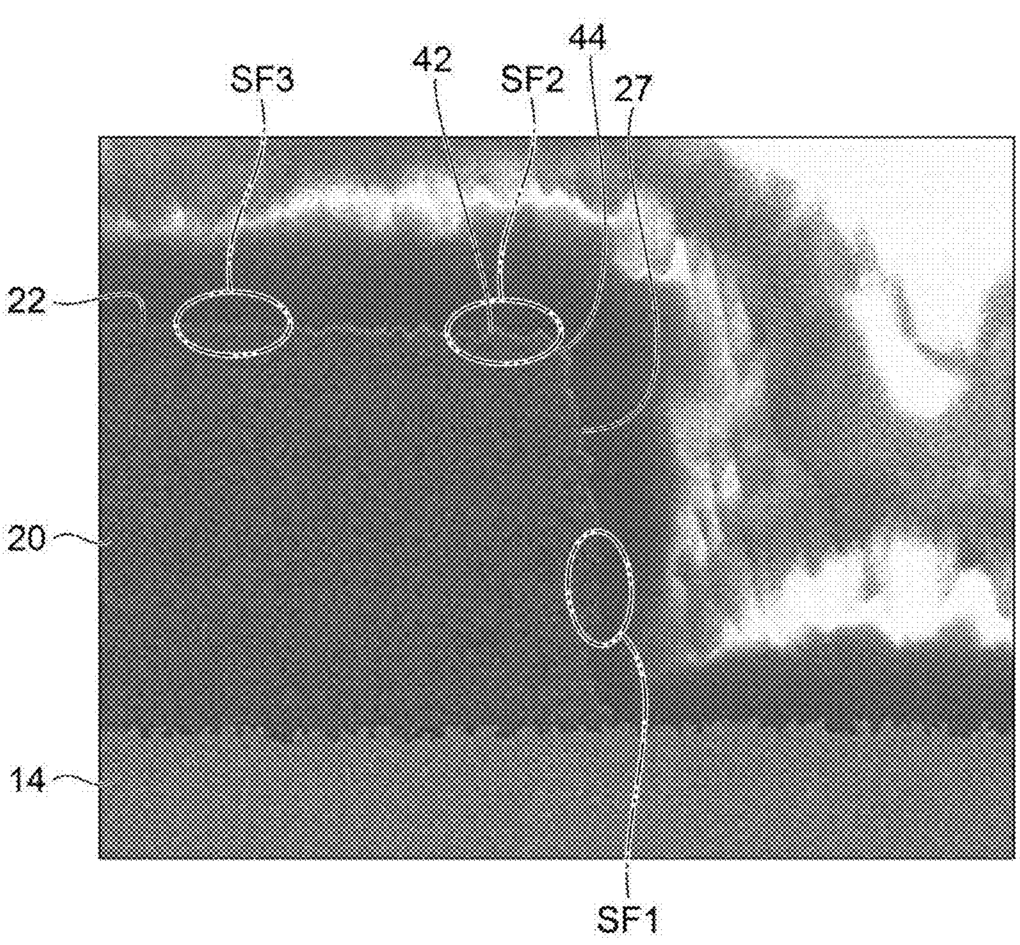
FIG. 2C is a partially enlarged cross-sectional photograph showing a printed wiring board according to an embodiment of the present invention.

FIG. 1 is a cross-sectional view illustrating a printed wiring board 2 of an embodiment. FIGS. 2A and 2B are each an enlarged cross-sectional view illustrating a part of the printed wiring board 2 of the embodiment. FIG. 2C is an enlarged cross-sectional photograph showing a part of the printed wiring board 2 of the embodiment. As illustrated in FIG. 1, the printed wiring board 2 includes an insulating layer 4, a first conductor layer 10, a resin insulating layer 20, a second conductor layer 30, and a via conductor 40.

The insulating layer 4 is formed using a resin. The insulating layer 4 may contain inorganic particles such as silica particles. The insulating layer 4 may contain a reinforcing material such as a glass cloth. The insulating layer 4 has a third surface 6 (upper surface in the drawing) and a fourth surface 8 (lower surface in the drawing) on the opposite side with respect to the third surface 6.

The first conductor layer 10 is formed on the third surface 6 of the insulating layer 4. The first conductor layer 10 includes a signal wiring 12 and a pad 14. The first conductor layer 10 may also include a conductor circuit other than the signal wiring 12 and the pad 14. The first conductor layer 10 is mainly formed of copper. The first conductor layer 10 is formed of a seed layer (10*a*) on the insulating layer 4 and an electrolytic plating layer (10*b*) on the seed layer (10*a*).

The resin insulating layer 20 is formed on the third surface 6 of the insulating layer 4 and on the first conductor layer 10. The resin insulating layer 20 has a first surface 22 (upper surface in the drawing) and a second surface 24 (lower surface in the drawing) on the opposite side with respect to the first surface 22. The second surface 24 of the resin insulating layer 20 faces the first conductor layer 10. The resin insulating layer 20 contains a resin 80 and a large number of inorganic particles 90. For the resin 80, for example, a thermosetting resin or a photocurable resin may be used. For the resin 80, as an example, an epoxy resin is used. The large number of inorganic particles 90 are dispersed in the resin 80. For the inorganic particles 90, for example, silica or alumina particles may be used. The inorganic particles 90 have, for example, an average particle size of 0.5 μm and particle sizes in a range of 0.1 μm or more and 5.0 μm or less.

The resin insulating layer 20 has a via hole 26 as a through hole that penetrates the resin insulating layer 20 in a thickness direction. An inner wall surface 27 of the via hole 26 is formed of the resin 80 and the inorganic particles 90. A surface roughness of a surface of a boundary part 42 at the first surface 22 of the resin insulating layer 20 is a boundary part surface roughness (SF2). The boundary part 42 includes a boundary 44 between the inner wall surface 27 of the via hole 26 and the first surface 22 of the resin insulating layer 20 and is a region where the land 36 is formed. The boundary part 42 has the boundary part surface roughness (SF2). A region having the boundary part surface roughness (SF2) is continuous from the boundary 44 to a position away from the boundary 44 by 10 μm or more and 20 μm or less on the first surface 22.

The boundary part surface roughness (SF2) can be defined by an arithmetic mean roughness (Ra) of the surface of the resin insulating layer 20 in the boundary part 42. The arithmetic mean roughness (Ra) of the surface of the resin insulating layer 20 in the boundary part 42 is, for example, in a range of 0.05 μm or more and 0.3 μm or less. The larger the value of the arithmetic mean roughness (Ra), the larger the surface roughness (that is, the rougher the surface).

As illustrated in FIG. 1, the first surface 22 of the resin insulating layer 20 is formed only of the resin 80. No inorganic particles 90 are exposed from the first surface 22. Specifically, the first surface 22 does not include surfaces of the inorganic particles 90. No unevenness is formed on the first surface 22 of the resin insulating layer 20. The first surface 22 is not roughened. The first surface 22 is formed smooth. On the first surface 22, a surface roughness of a region where the second conductor layer 30 is not formed is a first surface surface roughness (SF3). The first surface surface roughness (SF3) can be defined by an arithmetic mean roughness (Ra) of the first surface 22. The arithmetic mean roughness (Ra) of the first surface 22 is, for example, in a range of 0.005 μm or more and 0.1 μm or less.

On the other hand, the inorganic particles 90 are exposed on the inner wall surface 27 of the via hole 26. The inner wall surface 27 of the via hole 26 includes surfaces of the inorganic particles 90. The inner wall surface 27 of the via hole 26 has unevenness. The inner wall surface 27 of the via hole 26 is formed of an exposed surface of the resin 80 and exposed surfaces of the inorganic particles 90. A surface roughness of the inner wall surface 27 of the via hole 26 is a via hole surface roughness (SF1). The via hole surface roughness (SF1) can be defined by an arithmetic mean roughness (Ra) of the inner wall surface 27 of the via hole 26. The arithmetic mean roughness (Ra) of the inner wall surface 27 of the via hole 26 is, for example, in a range of 0.05 μm or more and 0.4 μm or less.

The via hole surface roughness (SF1), the boundary part surface roughness (SF2), and the first surface surface roughness (SF3) have the following relationship: $SF3<SF2\leq SF1$.

A thickness of the resin insulating layer 20 is two or more times a thickness of the second conductor layer 30. The thickness (T) of the resin insulating layer 20 is a distance between the first surface 22 and the upper surface of the first conductor layer 10.

As illustrated in FIG. 2B, the inner wall surface 27 of the via hole 26 is inclined. An angle (inclination angle) (θ1) between an upper surface of the pad 14 and the inner wall surface 27 is, for example, 70 degrees or more and 85 degrees or less. The upper surface of pad 14 is included in an upper surface of first conductor layer 10. An angle (inclination angle) (θ2) between the first surface (upper surface) 22 of the resin insulating layer 20 and the inner wall surface 27 is, for example, 95 degrees or more and 110 degrees or less.

As illustrated in FIG. 1, the second conductor layer 30 is formed on the first surface 22 of the resin insulating layer 20. The second conductor layer 30 includes a first signal wiring 32, a second signal wiring 34, and a land 36. The second conductor layer 30 may also include a conductor circuit other than the first signal wiring 32, the second signal wiring 34, and the land 36. The first signal wiring 32 and the second signal wiring 34 form a pair wiring. The second conductor layer 30 is mainly formed of copper. The second conductor layer 30 is formed of a seed layer (30*a*) on the first surface 22 and an electrolytic plating layer (30*b*) on the seed layer (30*a*). The seed layer (30*a*) is formed of a first seed layer (31*a*) on the first surface 22 and a second seed layer (31*b*) on the first seed layer (31*a*). The first seed layer (31*a*) is formed of an alloy (copper alloy) containing copper, silicon, and aluminum. The second seed layer (31*b*) is formed of copper. The electrolytic plating layer (30*b*) is formed of copper. The first seed layer (31*a*) is in contact with the first surface 22. The second seed layer (31*b*) adheres to the electrolytic plating layer (30*b*). A surface of the second conductor layer 30 facing the first surface 22 of the resin insulating layer 20 is formed along a surface shape of the first surface 22. The second conductor layer 30 does not enter an inner side of the first surface 22 of the resin insulating layer 20.

The via conductor 40 is formed in the via hole 26. The via conductor 40 connects the first conductor layer 10 and the second conductor layer 30, which are adjacent to each other in a lamination direction. The lamination direction is a direction in which the layers are laminated and is the same direction as the thickness direction of the layers. In the present embodiment, the lamination direction is the same as an up-down direction. In FIG. 1, the via conductor 40 connects the pad 14 and the land 36. The via conductor 40 is formed of a seed layer (30*a*) and an electrolytic plating layer (30*b*) on the seed layer (30*a*). The seed layer (30*a*) forming the via conductor 40 and the seed layer (30*a*) forming the second conductor layer 30 are common. The first seed layer (31*a*) is in contact with the inner wall surface 27.

A coating film layer 35 is formed on the surfaces of the resin insulating layer 20 and the second conductor layer 30. The coating film layer 35 increases adhesion of the resin insulating layer 20 and the second conductor layer 30 to other layers laminated on the resin insulating layer 20 and the second conductor layer 30. The coating film layer 35 may be omitted.

Method for Manufacturing Printed Wiring Board

Figure 3A:
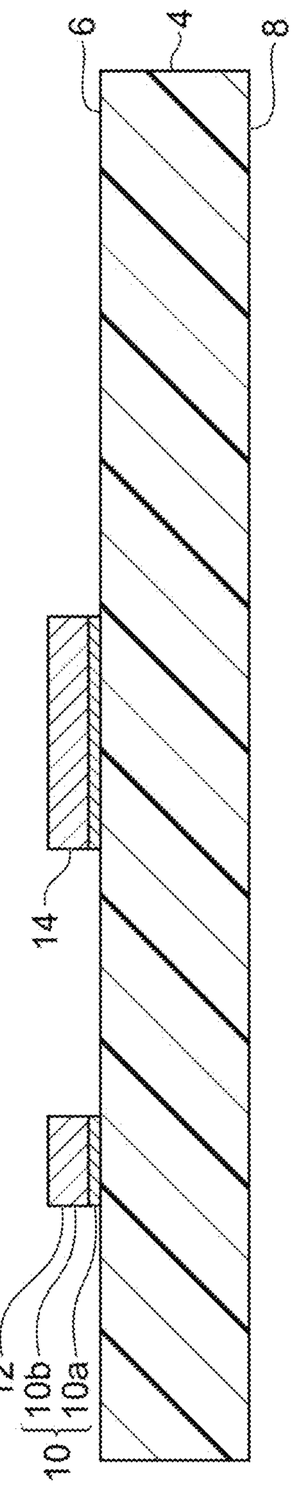
FIG. 3A is a cross-sectional view illustrating an example of a manufacturing process of a printed wiring board according to an embodiment of the present invention.

FIGS. 3A-31 illustrate a method for manufacturing the printed wiring board 2 of the embodiment. FIGS. 3A-31 are cross-sectional views. FIG. 3A illustrates the insulating layer 4 and the first conductor layer 10 formed on the third surface 6 of the insulating layer 4. The first conductor layer 10 is formed using a semi-additive method.

Figure 3B:
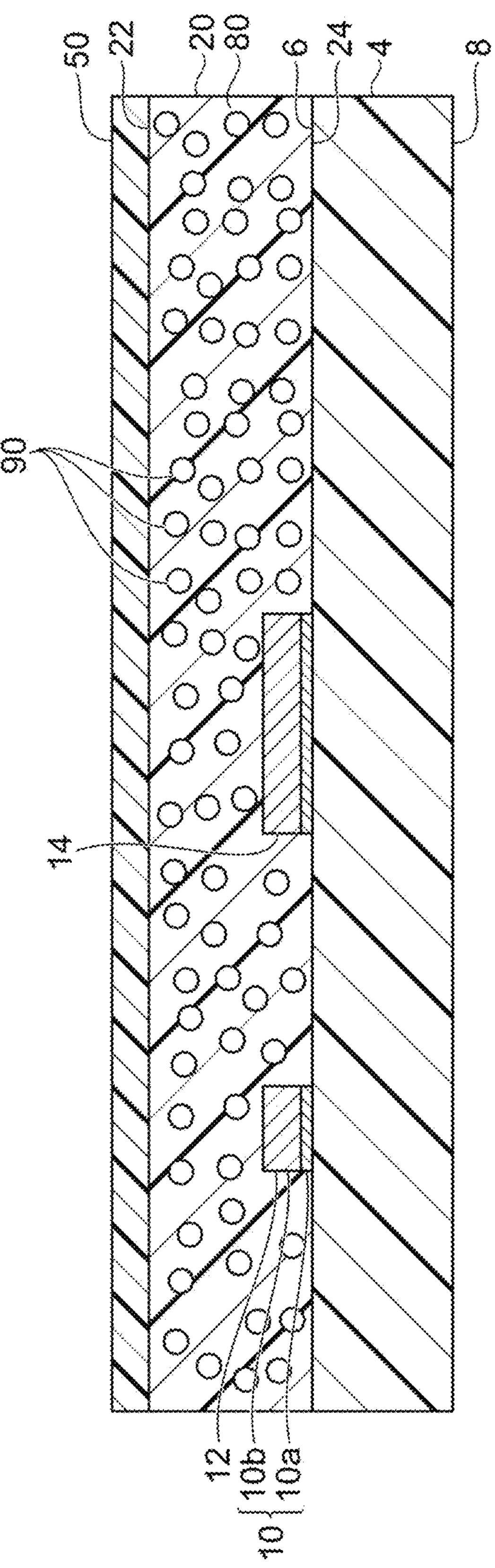
FIG. 3B is a cross-sectional view illustrating an example of a manufacturing process of a printed wiring board according to an embodiment of the present invention.

As illustrated in FIG. 3B, the resin insulating layer 20 and a protective film 50 are formed on the insulating layer 4 and the first conductor layer 10. The second surface 24 of the resin insulating layer 20 faces the third surface 6 of the insulating layer 4. The protective film 50 is formed on the first surface 22 of the resin insulating layer 20. The resin insulating layer 20 contains the resin 80 and the inorganic particles 90. The inorganic particles 90 are embedded in the resin 80. The first surface 22 of the resin insulating layer 20 is formed only of the resin 80. No inorganic particles 90 are exposed from the first surface 22. The first surface 22 does not include surfaces of the inorganic particles 90. No unevenness is formed on the first surface 22 of the resin insulating layer 20.

The protective film 50 completely covers the first surface 22 of the resin insulating layer 20. The protective film 50 is, for example, a film formed of polyethylene terephthalate (PET). A layer of a release agent is formed between the protective film 50 and the resin insulating layer 20.

Figure 3C:
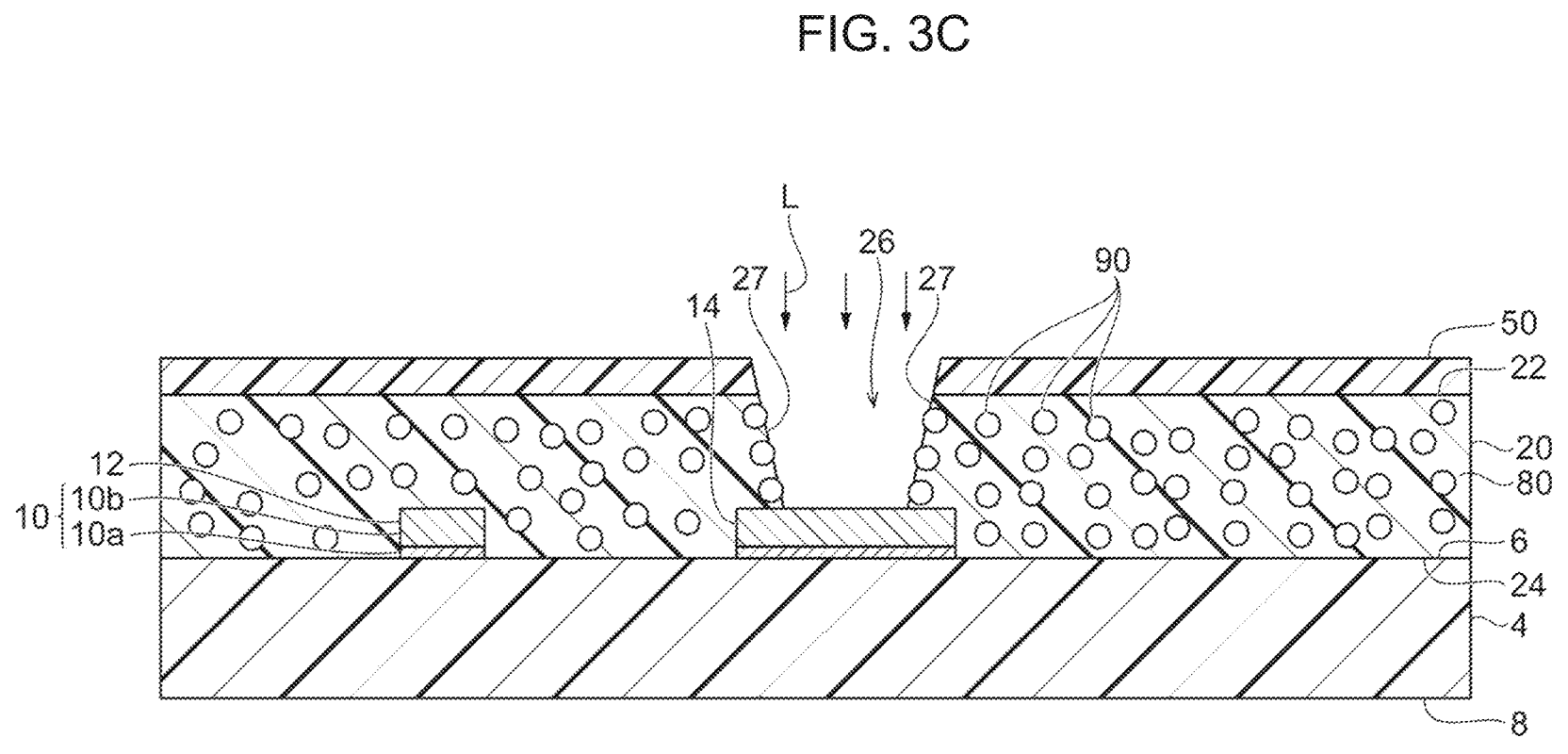

As illustrated in FIG. 3C, laser (L) is irradiated from above the protective film 50. The laser (L) penetrates the protective film 50 and the resin insulating layer 20 at the same time. The via hole 26 for a via conductor reaching the pad 14 of the first conductor layer is formed. The laser (L) is, for example, UV laser, or $CO_2$ laser. The pad 14 is exposed from the via hole 26. When the via hole 26 is formed, the first surface 22 of the resin insulating layer 20 is covered by the protective film 50. Therefore, when the via hole 26 is formed, even when the resin scatters, adherence of the resin to the first surface 22 is suppressed. The inner wall surface 27 of the via hole 26 after the laser irradiation is formed of the resin 80 and the inorganic particles 90 protruding from the resin 80.

Figure 3D:
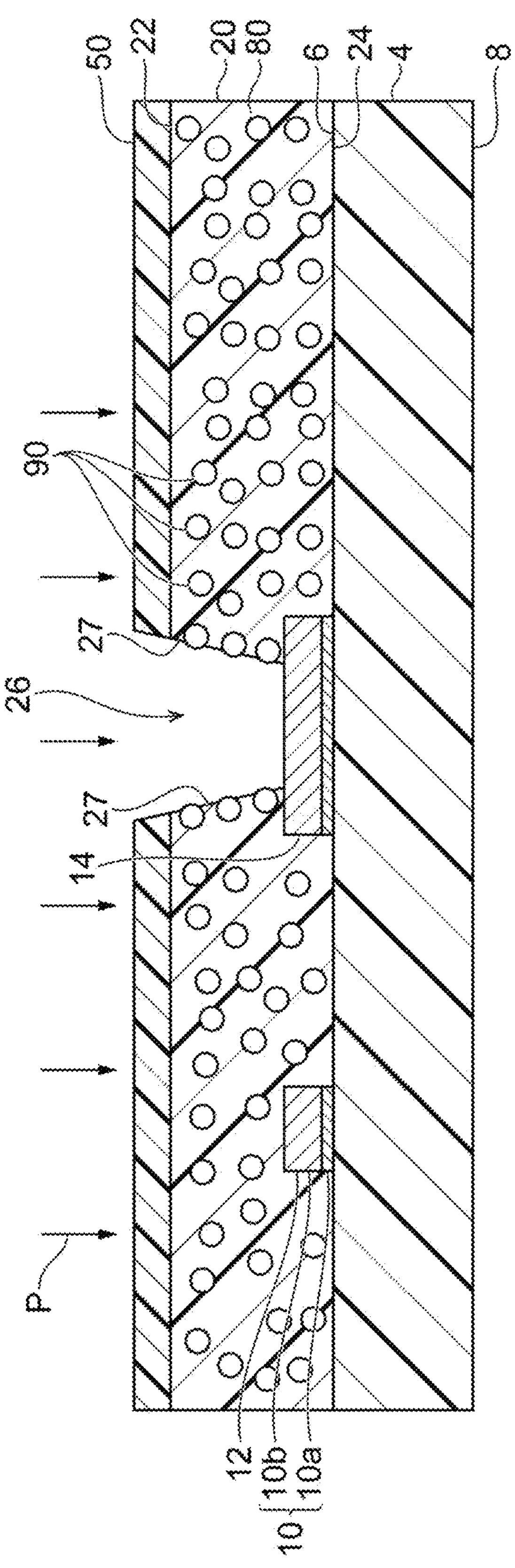
FIG. 3D is a cross-sectional view illustrating an example of a manufacturing process of a printed wiring board according to an embodiment of the present invention.

As illustrated in FIG. 3D, the inside of the via hole 26 is cleaned. By cleaning the inside of the via hole 26, resin residues generated when the via hole 26 is formed are removed. The cleaning of the inside of the via hole 26 is performed using a cleaning liquid (P). That is, the cleaning is performed with a wet process. The cleaning liquid is, for example, a potassium permanganate solution. For example, the cleaning is performed by immersing the printed wiring board 2 during a manufacturing process supported by a basket. The cleaning includes a desmear treatment.

By cleaning the inside of the via hole 26, the inorganic particles 90 are exposed on the inner wall surface 27 of the via hole 26 (FIG. 3D). The inner wall surface 27 of the via hole 26 includes surfaces of the inorganic particles 90. Unevenness is formed on the inner wall surface 27 of the via hole 26. By cleaning the inside of the via hole 26, the inner wall surface 27 of the via hole 26 is roughened. The arithmetic mean roughness (Ra) of the inner wall surface 27 of the via hole 26 is, for example, 0.05 μm or more and 0.4 μm or less. The arithmetic mean roughness (Ra) of the surface of the resin insulating layer 20 in the boundary part 42 is, for example, 0.05 μm or more and 0.3 μm or less. The arithmetic mean roughness (Ra) of the surface of the resin insulating layer 20 in the boundary part 42 is equal to or less than the arithmetic mean roughness (Ra) of the inner wall surface 27 of the via hole 26.

Figure 3E:
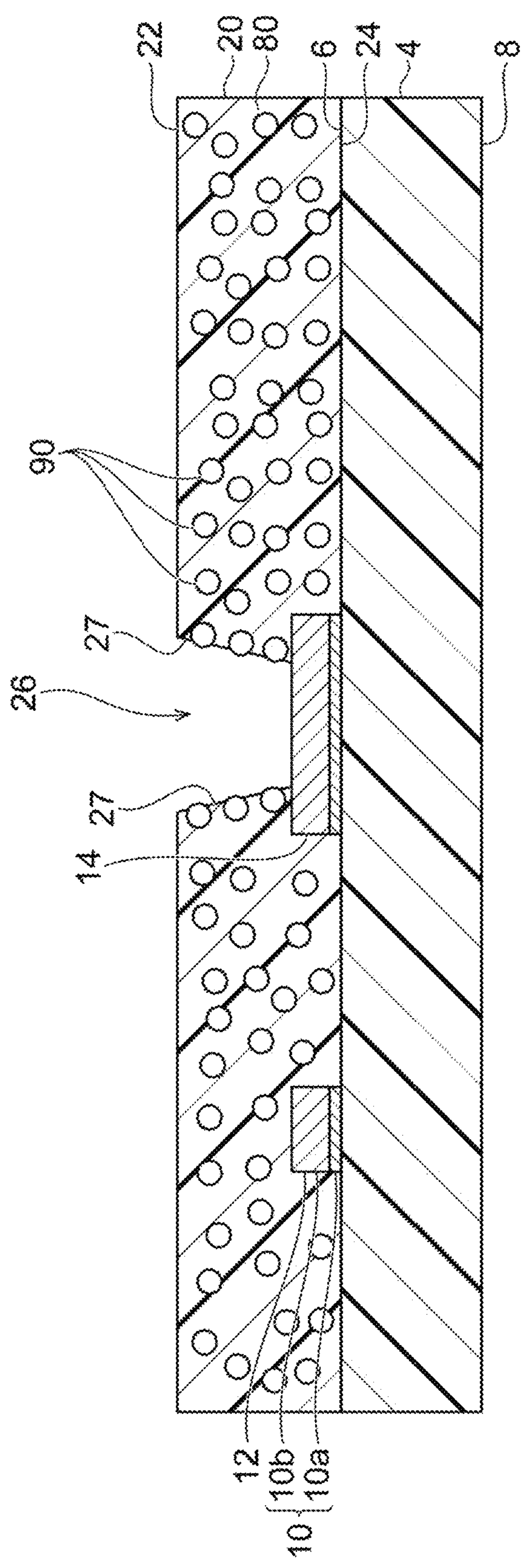
FIG. 3E is a cross-sectional view illustrating an example of a manufacturing process of a printed wiring board according to an embodiment of the present invention.

As illustrated in FIG. 3E, after cleaning the inside of the via hole 26, the protective film 50 is removed from the resin insulating layer 20. After the protective film 50 is removed, no roughening of the first surface 22 of the resin insulating layer 20 is performed. The first surface 22 is formed smooth. The arithmetic mean roughness (Ra) of the first surface 22 is, for example, 0.005 μm or more and 0.1 μm or less. The arithmetic mean roughness (Ra) of the first surface 22 is smaller than the arithmetic mean roughness (Ra) of the inner wall surface 27 of the via hole 26 and the arithmetic mean roughness (Ra) of the surface of the resin insulating layer 20 in the boundary part 42. The first surface 22 is formed of the resin 80 only. No inorganic particles 90 are exposed from the first surface 22. The first surface 22 does not include surfaces of the inorganic particles 90. No unevenness is formed on the first surface 22 of the resin insulating layer 20. The surface roughnesses of the inner wall surface 27 of the via hole 26, the boundary part 42, and the first surface 22 are respectively the surface roughness (SF1), the surface roughness (SF2), and the surface roughness (SF3).

Figure 3F:
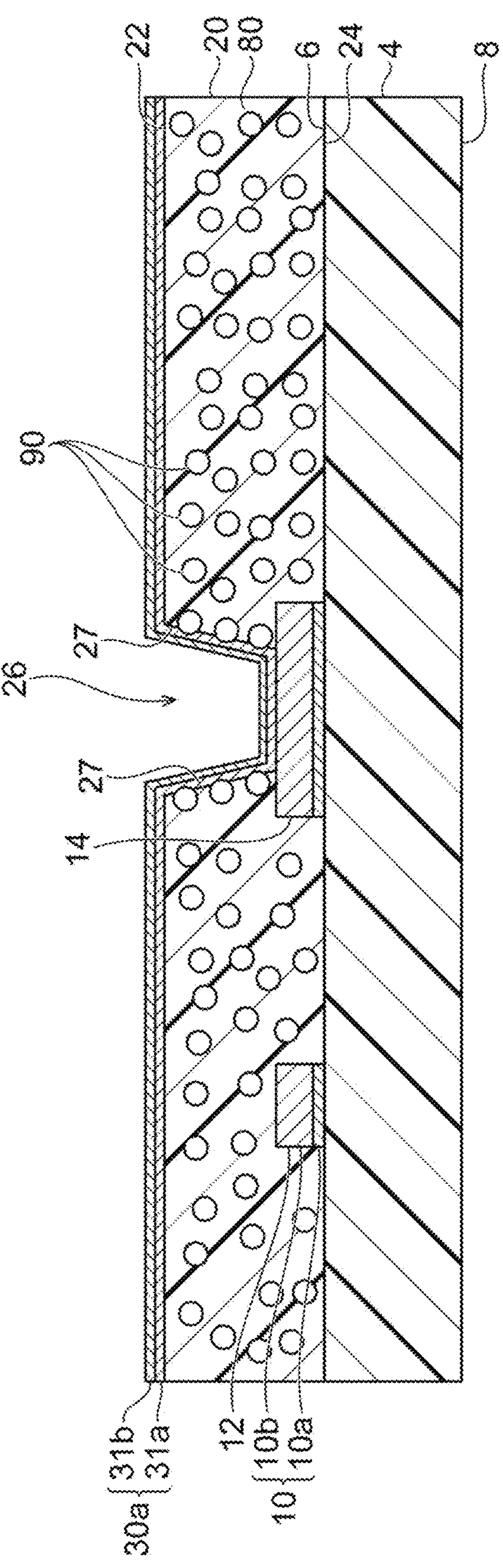
FIG. 3F is a cross-sectional view illustrating an example of a manufacturing process of a printed wiring board according to an embodiment of the present invention.

As illustrated in FIG. 3F, the seed layer (30*a*) is formed on the first surface 22 and the inner wall surface 27. The seed layer (30*a*) is formed by sputtering. The seed layer (30*a*) is a sputtered film. The formation of the seed layer (30*a*) is performed with a dry process. The first seed layer (31*a*) is formed on the first surface 22 by sputtering. At the same time, the first seed layer (31*a*) is formed on the inner wall surface 27 and the pad 14, which are exposed from the via hole 26, by sputtering. After that, the second seed layer (31*b*) is formed on the first seed layer (31*a*) by sputtering. The seed layer (30*a*) is also formed on the upper surface of the pad 14 exposed from the via hole 26 and on the inner wall surface 27 of the via hole 26. The first seed layer (31*a*) is formed of an alloy containing copper, silicon and aluminum. The second seed layer (31*b*) is formed of copper.

Figure 3G:
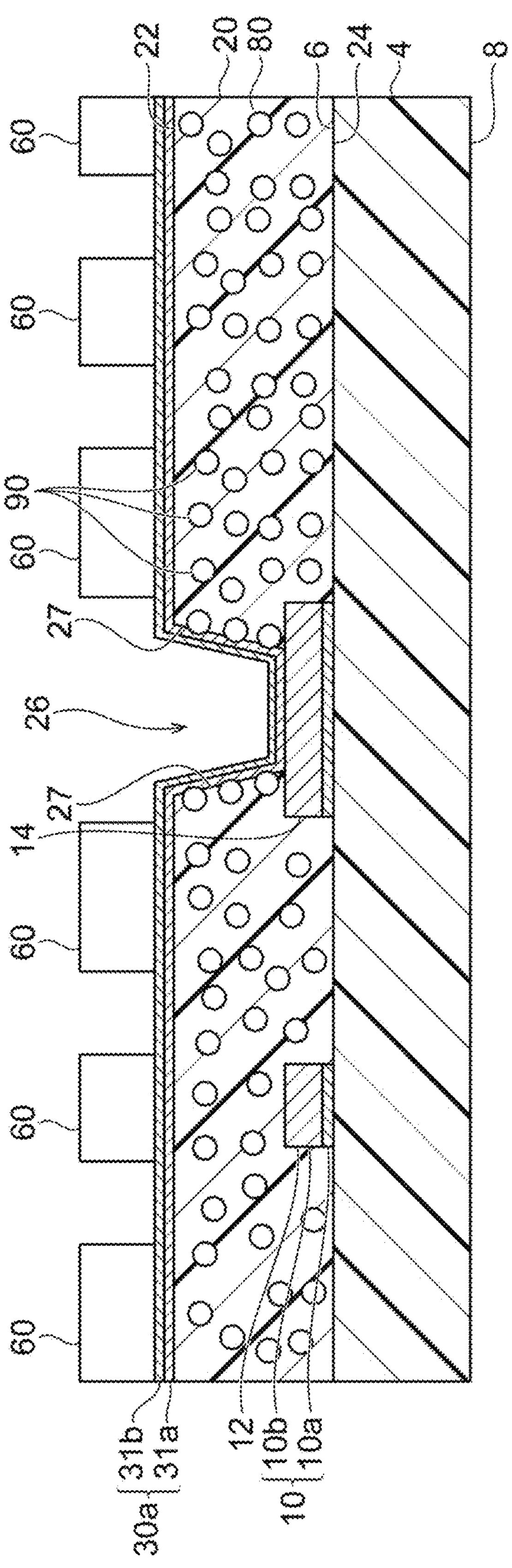
FIG. 3G is a cross-sectional view illustrating an example of a manufacturing process of a printed wiring board according to an embodiment of the present invention.

As illustrated in FIG. 3G, a plating resist 60 is formed on the seed layer (30*a*). The plating resist 60 has openings for forming the first signal wiring 32, the second signal wiring 34, and the land 36 (see FIG. 1).

Figure 3H:
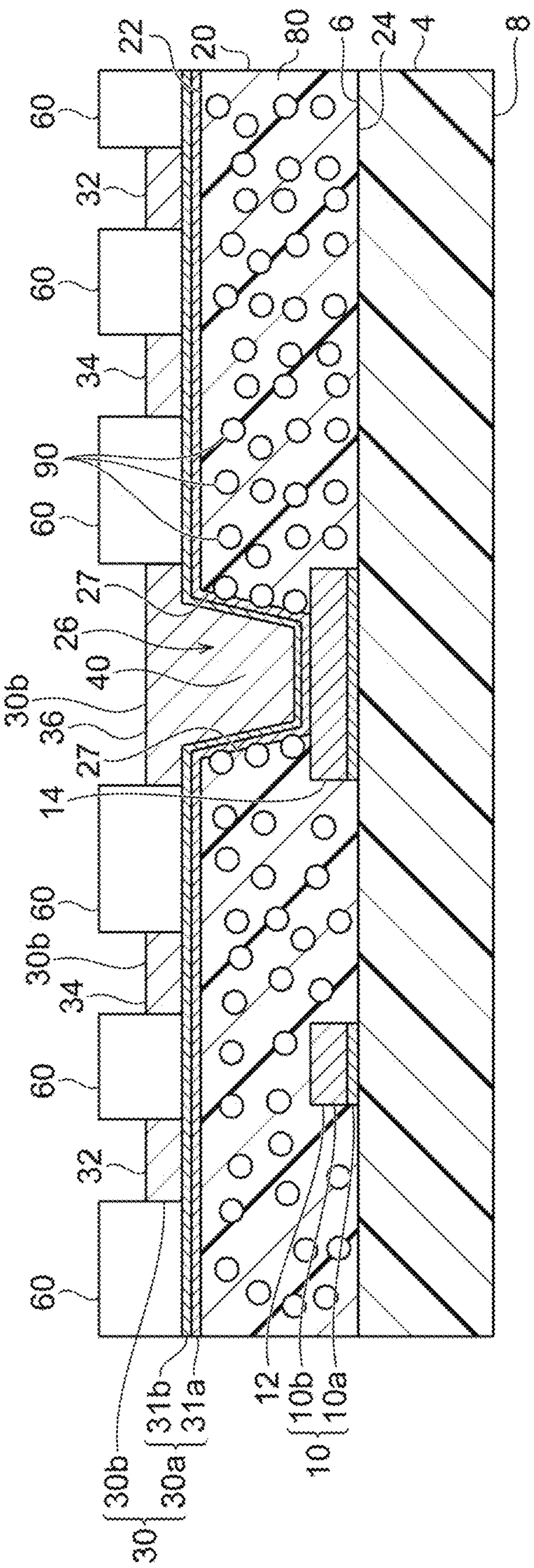
FIG. 3H is a cross-sectional view illustrating an example of a manufacturing process of a printed wiring board according to an embodiment of the present invention.

As illustrated in FIG. 3H, the electrolytic plating layer (30*b*) is formed on the seed layer (30*a*) exposed from the plating resist 60. The electrolytic plating layer (30*b*) is formed of copper. The electrolytic plating layer (30*b*) fills the via hole 26. The first signal wiring 32, the second signal wiring 34, and the land 36 are formed by the seed layer (30*a*) and the electrolytic plating film (30*b*) on the first surface 22. The second conductor layer 30 is formed. The via conductor 40 is formed by the seed layer (30*a*) and the electrolytic plating film (30*b*) in the via hole 26. The second conductor layer 30 and the via conductor 40 are formed at the same time. The via conductor 40 connects the pad 14 and the land 36. The first signal wiring 32 and the second signal wiring 34 form a pair wiring.

Figure 3I:
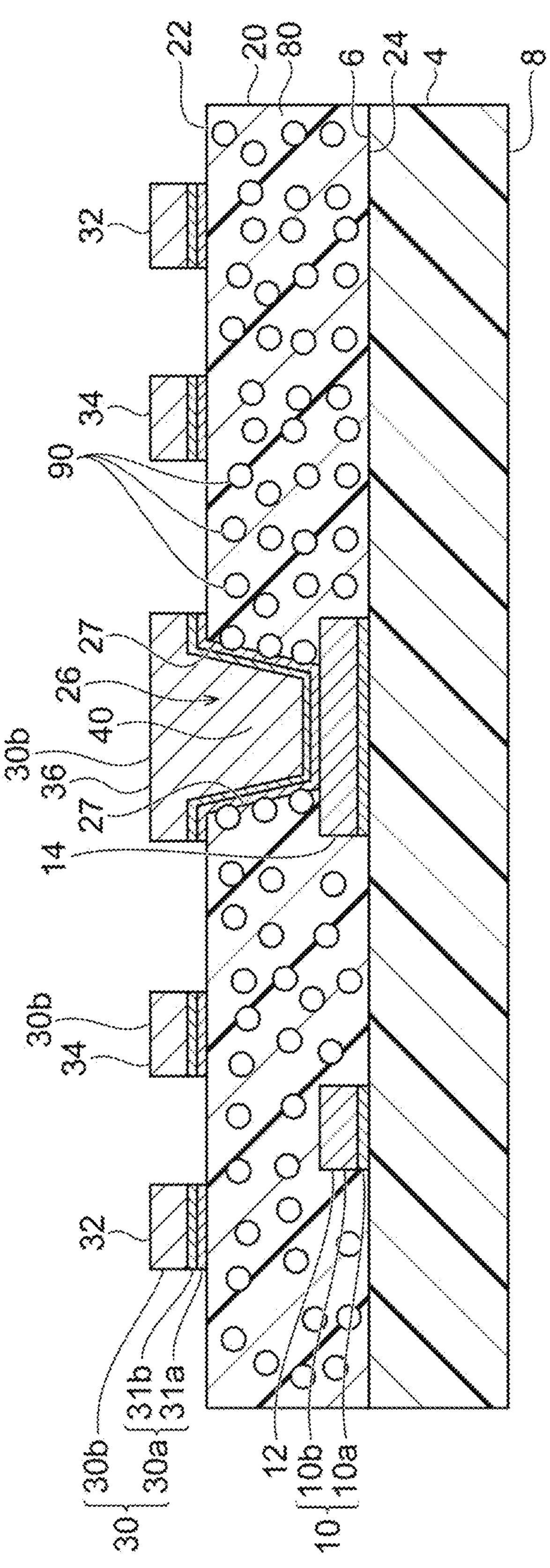
FIG. 3I is a cross-sectional view illustrating an example of a manufacturing process of a printed wiring board according to an embodiment of the present invention.

As illustrated in FIG. 3I, the plating resist 60 is removed. The seed layer (30*a*) exposed from the electrolytic plating layer (30*b*) is removed.

After that, when necessary, an $O_2$ ashing treatment is performed with respect to the first surface 22 of the resin insulating layer 20. In the $O_2$ ashing treatment, the first surface 22 of the resin insulating layer 20 is irradiated with $O_2$ plasma. By the irradiation with $O_2$ plasma, residues generated, for example, during an LIS treatment are removed from the first surface 22 of the resin insulating layer 20.

After that, the second conductor layer 30 is further subjected to a chemical conversion treatment. For example, the coating film layer 35 is formed on the surfaces of the resin insulating layer 20 and the second conductor layer 30. The printed wiring board 2 of the embodiment (see FIG. 1) is obtained.

In the printed wiring board 2 of the embodiment, the via hole surface roughness (SF1), the boundary part surface roughness (SF2), and the first surface surface roughness (SF3) have the following relationship: SF3<SF2≤SF1.

Since the boundary part surface roughness (SF2) and the via hole surface roughness (SF1) are larger than the first surface surface roughness (SF3), peeling of the first seed layer (31*a*) can be suppressed in the via hole 26 and the boundary part 42. In particular, since the boundary part surface roughness (SF2) is larger than the first surface surface roughness (SF3), peeling of the first seed layer (31*a*) can be suppressed in the boundary part 42. Since peeling of the first seed layer (31*a*) can be suppressed, peeling of the second conductor layer 30 at the via conductor 40 can also be suppressed.

In the printed wiring board 2 of the embodiment, the region having the boundary part surface roughness (SF2) is continuous from the boundary 44 to a position away from the boundary 44 by 10 μm or more and 20 μm or less on the first surface 22. Since the range of the region having the boundary part surface roughness (SF2) is 10 μm or more from the boundary 44, peeling of the first seed layer (31*a*) can be suppressed compared to a case where the range is less than 10 μm. Since the range of the region having the boundary part surface roughness (SF2) is 20 μm or less from the boundary 44, a region having the first surface surface roughness (SF3) can be secured compared to a case where the range exceeds 20 μm. Since the region having the first surface surface roughness (SF3) can be secured, removal of the seed layer (30*a*) is easy in a manufacturing process of the printed wiring board 2 (FIG. 3I).

In the printed wiring board 2 of the embodiment (see FIG. 1), the first surface 22 of the resin insulating layer 20 is formed of the resin 80. The inorganic particles 90 are not exposed on the first surface 22. No unevenness is formed on the first surface 22. An increase in standard deviation of a relative permittivity in a portion near the first surface 22 of the resin insulating layer 20 is suppressed. The relative permittivity of the first surface 22 does not significantly vary depending on a location. Even when the first signal wiring 32 and the second signal wiring 34 are in contact with the first surface 22, a difference in propagation speed of an electrical signal between the first signal wiring 32 and the second signal wiring 34 can be reduced. Therefore, in the printed wiring board 2 of the embodiment, noise is suppressed. Even when a logic IC is mounted on the printed wiring board 2 of the embodiment, data transmitted via the first signal wiring 32 and data transmitted via the second signal wiring 34 arrive at the logic IC substantially without delay. Malfunction of the logic IC can be suppressed. Even when a length of the first signal wiring 32 and a length of the second signal wiring 34 are 5 mm or more, a difference in propagation speed between the two can be reduced. Even when the length of the first signal wiring 32 and the length of the second signal wiring 34 are 10 mm or more and 20 mm or less, malfunction of the logic IC can be suppressed. A high quality printed wiring board 2 is provided.

In the printed wiring board 2 of the embodiment (see FIG. 1), the thickness (T) of the resin insulating layer 20 is two or more times the thickness of the second conductor layer 30. It is thought that, when the printed wiring board 2 is subjected to heat cycles, a stress applied between the inner wall surface 27 of the via hole 26 and the via conductor is greater than a stress applied between the first surface 22 and the second conductor layer 30. Further, the inner wall surface 27 of the via hole 26 has unevenness. Therefore, adhesion strength between the inner wall surface 27 of the via hole 26 and the via conductor 40 is higher than adhesion strength between the first surface 22 and the second conductor layer 30. The via conductor 40 is unlikely to peel off from the resin insulating layer 20. The second conductor layer 30 is unlikely to peel off from the resin insulating layer 20.

In the printed wiring board 2 of the embodiment, the seed layer (30*a*) is formed by sputtering (see FIG. 3E). Particles forming the seed layer (30*a*) perpendicularly collide with the first surface 22. Therefore, adhesion strength between the first surface 22 and the seed layer (30*a*) is high. On the other hand, the particles forming the seed layer (30*a*) obliquely collide with the inner wall surface 27 of the via hole 26. However, the inner wall surface 27 of the via hole 26 has unevenness. Therefore, adhesion strength between the seed layer (30*a*) and the inner wall surface 27 of the via hole 26 is high. Even when the first surface 22 does not have unevenness and the inner wall surface 27 of the via hole 26 has unevenness, a difference between the adhesion strength between the second conductor layer 30 and the first surface 22 and the adhesion strength between the via conductor 40 and the inner wall surface 27 of the via hole 26 can be reduced. A stress is unlikely to concentrate on an interface between the second conductor layer 30 and the first surface 22. A stress is unlikely to concentrate on an interface between the via conductor and the inner wall surface 27 of the via hole 26. Even when the printed wiring board 2 is subjected to heat cycles, the via conductor 40 is unlikely to peel off from the resin insulating layer 20. A high quality printed wiring board 2 is provided.

The first seed layer (31*a*) of the seed layer (30*a*) is formed of copper and a second element. The second element is selected from silicon, aluminum, titanium, nickel, chromium, carbon, oxygen, tin, calcium, magnesium, iron, molybdenum, and silver. The first seed layer (31*a*) is formed of an alloy containing copper. The second seed layer (31*b*) is formed of copper. An amount of copper (atomic weight %) forming the second seed layer (31*b*) is 99.9% or more, and preferably 99.95% or more.

It is also possible that the first seed layer (31*a*) of the seed layer (30*a*) is formed of any one of silicon, aluminum, titanium, nickel, chromium, carbon, oxygen, tin, calcium, magnesium, iron, molybdenum, and silver.

In the printed wiring board 2, the resin insulating layer 20 contains the resin 80 and the inorganic particles 90. However, the resin insulating layer 20 may also contain a fiber reinforcing material. As the fiber reinforcing material, for example, a glass cloth, a glass nonwoven fabric, or an aramid nonwoven fabric may be used.

In the printed wiring board 2, one resin insulating layer is laminated. However, it is also possible that two or more resin insulating layers are laminated.

A printed wiring board according to an embodiment of the present invention is not limited to those having the structures exemplified in the drawings and those having the structures, shapes, and materials exemplified in the present specification. As described above, the printed wiring board of the embodiment can have any laminated structure. For example, the wiring substrate of the embodiment may be a coreless substrate that does not include a core substrate. The printed wiring board of the embodiment can include any number of conductor layers and any number of insulating layers.

A method for manufacturing a printed wiring board according to an embodiment of the present invention is not limited to the method described with reference to the drawings. For example, the insulating layers can each be formed using a resin in any form without being limited to a film-like resin. In the method for manufacturing the printed wiring board of the embodiment, it is also possible that any process other than the processes described above is added, or some of the processes described above are omitted.

Japanese Patent Application Laid-Open Publication No. 2009-76934 describes a multilayer printed wiring board formed by alternately laminating interlayer resin insulating layers and conductor patterns, in which a plane layer is formed on a lower-layer interlayer resin insulating layer, the plane layer is connected to a lower-layer conductor pattern via a via hole formed by filling an opening provided in the lower-layer interlayer resin insulating layer with metal, and a recess is formed on a surface of the via hole. Japanese Patent Application Laid-Open Publication No. 2009-76934 describes that a roughened surface with a depth of 4 μm is formed on a surface of an interlayer resin insulating layer, and that this roughened surface is similarly formed on an inner side surface of an opening.

In a resin insulating layer of a printed wiring board, it is desirable to prevent a conductor layer that is continuous from a via conductor in a via hole from peeling off from the resin insulating layer.

A printed wiring board according to an embodiment of the present invention includes: a first conductor layer; a resin insulating layer that has a first surface and a second surface on the opposite side with respect to the first surface, is formed on the first conductor layer with the second surface facing the first conductor layer, and has a via hole exposing the first conductor layer; a second conductor layer that is formed on the first surface of the resin insulating layer; and a via conductor that is formed in the via hole and connects the first conductor layer and the second conductor layer. When a surface roughness of an inner wall surface of the via hole is a via hole surface roughness, a surface roughness of the resin insulating layer at a boundary part between the via hole and the first surface is a boundary part surface roughness, and a surface roughness of the first surface is a first surface surface roughness, the boundary part surface roughness is larger than the first surface surface roughness, and the via hole surface roughness is equal to or larger than the boundary part surface roughness.

In an embodiment of the present invention, a conductor layer that is continuous from a via conductor in a via hole in a resin insulating layer can be prevented from peeling off from the resin insulating layer.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:

a first conductor layer;

a resin insulating layer formed on the first conductor layer;

a second conductor layer formed on a surface of the resin insulating layer; and a via conductor formed in the resin insulating layer such that the via conductor is connecting the first conductor layer and the second conductor layer and has a land portion extending on a boundary part of the resin insulating layer, wherein the via conductor is formed in a via hole formed in the resin insulating layer, and the resin insulating layer is formed such that the boundary part has a surface roughness that is larger than a surface roughness of the surface on which the second conductor layer is formed and that a surface roughness of an inner wall surface in the via hole formed in the resin insulating layer is equal to or larger than the surface roughness of the boundary part of the resin insulating layer.

2. The printed wiring board according to claim 1, wherein the resin insulating layer is formed such that the boundary part is a region in a range of 10 μm to 20 μm from a boundary of the via hole.

3. The printed wiring board according to claim 1, wherein the resin insulating layer includes resin and inorganic particles.

4. The printed wiring board according to claim 3, wherein the resin insulating layer is formed such that the surface on which the second conductor layer is formed is consisting of the resin.

5. The printed wiring board according to claim 3, wherein the resin insulating layer is formed such that the inner wall surface in the via hole includes the resin and the inorganic particles.

6. The printed wiring board according to claim 1, wherein the resin insulating layer is formed such that an arithmetic mean roughness Ra of the inner wall surface in the via hole is in a range of 0.05 μm to 0.4 μm, an arithmetic mean roughness Ra of a surface of the boundary part is in a range of 0.05 μm to 0.3 μm, and an arithmetic mean roughness Ra of the surface on which the second conductor layer formed is in a range of 0.005 μm to 0.1 μm.

7. The printed wiring board according to claim 1, wherein the second conductor layer includes a seed layer formed on the surface of the resin insulating layer.

8. The printed wiring board according to claim 7, wherein the seed layer is a sputtered film.

9. The printed wiring board according to claim 2, wherein the resin insulating layer includes resin and inorganic particles.

10. The printed wiring board according to claim 9, wherein the resin insulating layer is formed such that the surface on which the second conductor layer is formed is consisting of the resin.

11. The printed wiring board according to claim 9, wherein the resin insulating layer is formed such that the inner wall surface in the via hole includes the resin and the inorganic particles.

12. The printed wiring board according to claim 2, wherein the resin insulating layer is formed such that an arithmetic mean roughness Ra of the inner wall surface in the via hole is in a range of 0.05 μm to 0.4 μm, an arithmetic mean roughness Ra of a surface of the boundary part is in a range of 0.05 μm to 0.3 μm, and an arithmetic mean roughness Ra of the surface on which the second conductor layer formed is in a range of 0.005 μm to 0.1 μm.

13. The printed wiring board according to claim 2, wherein the second conductor layer includes a seed layer formed on the surface of the resin insulating layer.

14. The printed wiring board according to claim 13, wherein the seed layer is a sputtered film.

15. The printed wiring board according to claim 3, wherein the resin insulating layer is formed such that an arithmetic mean roughness Ra of the inner wall surface in the via hole is in a range of 0.05 μm to 0.4 μm, an arithmetic mean roughness Ra of a surface of the boundary part is in a range of 0.05 μm to 0.3 μm, and an arithmetic mean roughness Ra of the surface on which the second conductor layer formed is in a range of 0.005 μm to 0.1 μm.

16. The printed wiring board according to claim 3, wherein the second conductor layer includes a seed layer formed on the surface of the resin insulating layer.

17. The printed wiring board according to claim 16, wherein the seed layer is a sputtered film.

18. The printed wiring board according to claim 4, wherein the resin insulating layer is formed such that the inner wall surface in the via hole includes the resin and the inorganic particles.

19. The printed wiring board according to claim 4, wherein the resin insulating layer is formed such that an arithmetic mean roughness Ra of the inner wall surface in the via hole is in a range of 0.05 μm to 0.4 μm, an arithmetic mean roughness Ra of a surface of the boundary part is in a range of 0.05 μm to 0.3 μm, and an arithmetic mean roughness Ra of the surface on which the second conductor layer formed is in a range of 0.005 μm to 0.1 μm.

20. The printed wiring board according to claim 4, wherein the second conductor layer includes a seed layer formed on the surface of the resin insulating layer.

* * * * *